United States Patent
Iguchi et al.

Patent Number: 5,161,748
Date of Patent: Nov. 10, 1992

[54] SEAT BELT RETRACTOR

[75] Inventors: Hiroshi Iguchi; Yasuo Tsuji, both of Shiga, Japan

[73] Assignee: Takata Corporation, Tokyo, Japan

[21] Appl. No.: 663,458

[22] Filed: Mar. 4, 1991

[30] Foreign Application Priority Data

Apr. 11, 1990 [JP] Japan .................................. 2-95495

[51] Int. Cl.$^5$ .......................................... B65H 75/48
[52] U.S. Cl. .................................... 242/107; 384/192; 384/275
[58] Field of Search ......... 242/107, 107.4 R, 107.4 E; 384/275, 192

[56] References Cited

U.S. PATENT DOCUMENTS

| | | | |
|---|---|---|---|
| 4,678,349 | 7/1987 | Yoshigai | 384/192 X |
| 4,940,002 | 7/1990 | Bien | 384/192 X |

Primary Examiner—John M. Jillions
Attorney, Agent, or Firm—Kanesaka and Takeuchi

[57] ABSTRACT

In a seat belt retractor comprising a frame which has a pair of side walls facing each other, shaft supporting holes which are provided at the side walls, respectively, a rotatable shaft which is provided between the supporting holes, a bush for supporting the shaft, the bush being attached to at least one of the supporting holes, and a reel which is attached to the shaft and on which a seat belt is wound, the bush is made of synthetic resin and comprises a cylindrical portion in which a shaft portion of a body of rotation is inserted and a flange portion which is provided so as to be coaxial with the cylindrical portion, the portion on one end side in the axial direction of the inside circumference face of the cylindrical portion being tapered so as to increase the diameter in the direction of approaching the one end side.

3 Claims, 4 Drawing Sheets

SEAT BELT RETRACTOR

FIELD AND RELATED ART STATEMENT

The present invention relates to a seat belt retractor with a bush made of synthetic resin for bearing a body of rotation.

An arrangement of a conventional seat belt retractor is described below with reference to FIG. 3. The retractor is for the purpose of retracting a seat belt (webbing) of a seat belt apparatus which is for binding an occupant of a vehicle and protecting the occupant in an emergency. As known well, in the retractor, a seat belt is wound on a rotatable reel.

FIG. 3 is an exploded perspective view which shows an example of a seat belt apparatus with the retractor.

In FIG. 3, supporting holes $1a$ and $1b$ are formed on both side walls 1A and 1B, respectively, of a substantially U-shaped frame 1. The supporting holes $1a$ and $1b$ are coaxial with each other. A shaft 2 to which a webbing (not shown) is fixed is supported by the supporting holes $1a$ and $1b$ through a bush 3 made of synthetic resin so as to rotate freely around its axis. A reel 4 is disposed on the shaft 2 on which, between both the side walls 1A and 1B the webbing is wound.

One end of the shaft 2 is connected with an end of a return spring 5 on the center side. The other end of the return spring 5 on the peripheral side is fixed to the side wall 1A through a cover 6. When a seat belt is drawn out, the reel 4 rotates in the direction of storing power of the return spring 5. When an occupant leaves his hand from the seat belt, by the encouraging force of the return spring 5, the reel 4 is rotated, and the seat belt is automatically drawn on the reel 4. When the seat belt is drawn out, the shaft 2 is rotated in the direction shown by an arrow $A_1$.

A lock mechanism 10 of the seat belt in an emergency is provided outside the side wall 1B.

In an emergency such as a collision, when tension acts on the webbing (not shown) and an impacting rotational force in the direction shown by the arrow $A_1$ acts on the shaft 2, a flywheel 19 is, by the operation of force of inertia due to delay of rotation, relatively rotationally displaced in the direction shown by an arrow $A_2$ with respect to the rotation in the direction shown by the arrow $A_1$. Then, a hook 16 sways in the direction shown by an arrow $B_2$ against encouraging force of a compression spring 17, and a pawl 16A is locked with internal teeth 13A of a lock ring 13. Then, the rotational force which acts on the shaft 2 is transmitted to the lock ring 13 through a hook retainer 15, the pawl 16A, and the internal teeth 13A, and the lock ring 13 is rotated in the direction shown by the arrow $A_1$.

Then, a pawl guide hole 13E which is engaged with a pawl guide pin 20A rotates a pawl 20 in the direction shown by an arrow $C_1$ through the pawl guide pin 20A and makes the pawl 20 engage with a ratchet wheel 11. Consequently, the rotation of the shaft 2 in the direction shown by the arrow $A_1$, that is, drawing the seat belt out, is restrained and locked.

When the tension which acts on the seat belt is released, by rotating the lock ring 13 in the direction shown by the arrow $A_2$ through the engaging force of a spring member 7, the pawl 20 is rotated in the direction shown by an arrow $C_2$, the lock of the ratchet wheel 11 is released, and the seat belt can be drawn out freely.

In FIG. 3, the numeral 7 designates the spring member, and numerals 12, 18, 21, and 22 designate a tie plate, a friction catching member, an axially supporting pin, and a cover, respectively.

The lock mechanism of a seat belt in an emergency as above referred to is only an example among well known lock mechanisms, and various kinds of lock mechanisms may be adapted.

As shown in FIG. 3, in a retractor of a seat belt, the shaft 2 is rotatably provided between the holes $1a$ and $1b$ of the side walls 1A and 1B of the substantially U-shaped frame 1, and the seat belt is drawn out and retracted. In order to make the shaft 2 rotate smoothly, the bush 3 made of synthetic resin is used.

The bush 3 has, as shown in FIG. 4, a cylindrical portion $3a$ and a flange portion $3b$ which is integral with the cylindrical portion $3a$. In a conventional bush 3, the inside diameter and the outside diameter of the cylindrical portion $3a$ are uniform throughout the axis. Also, the thickness of the flange portion $3b$ is uniform from the inside circumference edge to the outside circumference edge.

The frame 1 is formed by pressing a steel plate and by bending the side walls 1A and 1B. Therefore, the precision in the size of the frame is not necessarily high and there is a subtle discrepancy between the axis of the supporting hole $1a$ and the axis of the supporting hole $1b$. Consequently, it often occurs that the shaft 2 is inserted in and supported by the frame 1 with the axis of the shaft 2 slanting with respect to the axis of the bush 3.

In case the axis of the shaft 2 and the axis of the bush 3 cross each other in this way, the shaft 2 is partially pressed strongly against the bush 3 and a smooth rotation is obstructed Namely, a part of the outside circumference face of the shaft 2 is strongly pressed against a part of the inner circumference face of the cylindrical portion $3a$. Also, a part of the plate surface of the ratchet wheel 11 is strongly pressed against the flange portion $3b$.

One way to solve these difficult problems may make the diameters of the holes $1a$ and $1b$ and the bush 3 larger than that of the shaft 2. However, this leads to looseness of the shaft 2, which is a cause of making a noise and thus, this is not preferable.

OBJECT AND SUMMARY OF THE INVENTION

The object of the present invention is to provide a seat belt retractor with which a shaft is always smoothly rotated, looseness and noise during the rotation of the shaft are prevented, and a frame when it is formed can be easily and precisely made.

According to the present invention, a seat belt retractor comprising a frame which has a pair of side walls facing each other, shaft supporting holes which are provided at the side walls, respectively, a rotatable shaft which is provided between the supporting holes, a bush for supporting the shaft attached to at least one of the supporting holes, and a reel which is attached to the shaft and on which a seat belt is wound, wherein the following improvement is made with respect to the bush so that the shaft can rotate smoothly, looseness and noise can be prevented, a frame can be easily and precisely made.

A bush according to a first embodiment of the present invention is a bush made of synthetic resin and having a cylindrical portion in which a shaft portion of a body is inserted and a flange portion which is provided so as to be coaxial with the cylindrical portion, characterized in that a portion on one end side in the axial direction of the inside circumference face of the cylindrical portion is tapered so as to increase the diameter in the direction of approaching the one endside.

In the bush according to the first embodiment of the present invention, as a tapered face is provided on the inside circumference face of the cylindrical portion, even if the axis of the rotatable shaft which is inserted in the cylindrical portion slants with respect to the axis of the cylindrical portion, the rotatable shaft is prevented from being partially strongly pressed against the inside circumference face of the bush.

A bush according to a second embodiment of the present invention is a bush according to the first embodiment wherein the flange portion is provided on the one end side in the axial direction of the cylindrical portion and the outside circumference face of the cylindrical portion at the other end side is tapered so as to decrease the outside diameter in the direction of approaching the other endside.

In the bush according to the second embodiment of the present invention, there is a gap at the portion on the other end side of the cylindrical portion between the outside circumference face of the bush and the inside circumference face of the supporting hole in which the bush is inserted. Therefore, the other end side of the cylindrical portion is elastically deformable with respect to the one end side of the cylindrical portion. As a result, according to the bush, the body can be elastically supported.

A bush according to a third embodiment of the present invention is a bush according to the second embodiment wherein a portion adjacent to the outside circumference edge of the plate surface on the one end side of the flange portion is tapered so as to decrease the thickness in the direction of approaching the outside circumference.

In the bush according to the third embodiment of the present invention, a plate surface of a disc-like body for example, a ratchet wheel which is provided orthogonally with respect to the axis of rotation is prevented from being partially strongly pressed against the flange portion.

DESCRIPTION OF THE PREFERRED EMBODIMENTS

Figure 1:
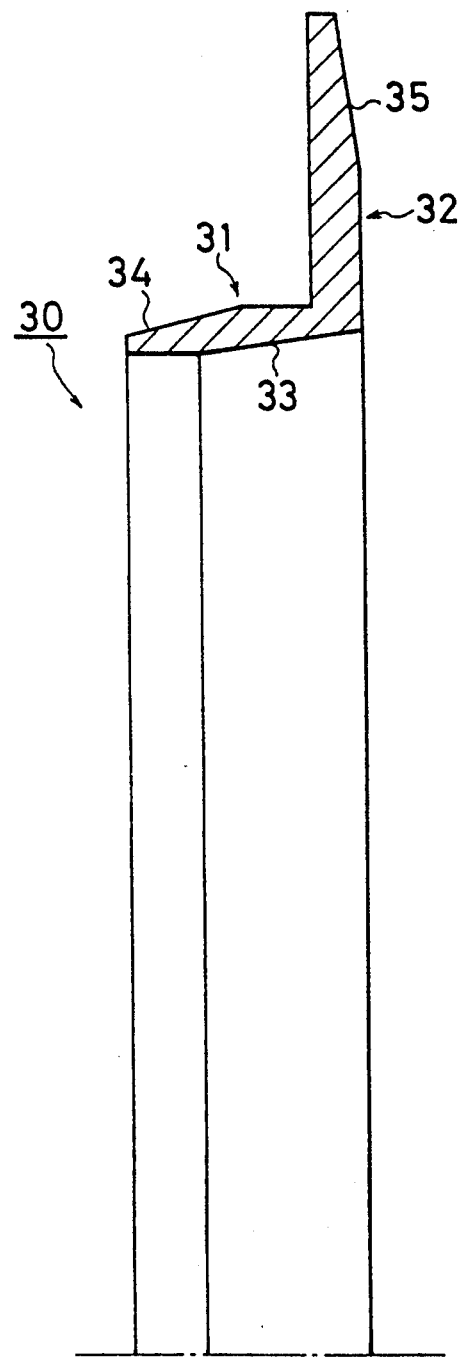
FIG. 1 is a sectional view of a bush as an embodiment of the present invention.

FIG. 1 is a sectional view taken on a line parallel to the axis of a bush 30 as an embodiment of the present invention. The bush 30 is flexible and made of synthetic resin and has a cylindrical portion 31 and a flange portion 32 formed integrally with the cylindrical portion 31 on a one end side seen in the direction of the axis of the cylindrical portion 31.

A tapered face 33 is formed on the one end side of the inside circumference face of the cylindrical portion 31 so as to increase the inside diameter of the cylindrical portion 31 in the direction of approaching the one end side. A tapered face 34 is formed on the other end side of the outside circumference face of the cylindrical portion 31 so as to decrease the outside diameter of the cylindrical portion 31 in the direction of approaching the other end side.

Figure 5:
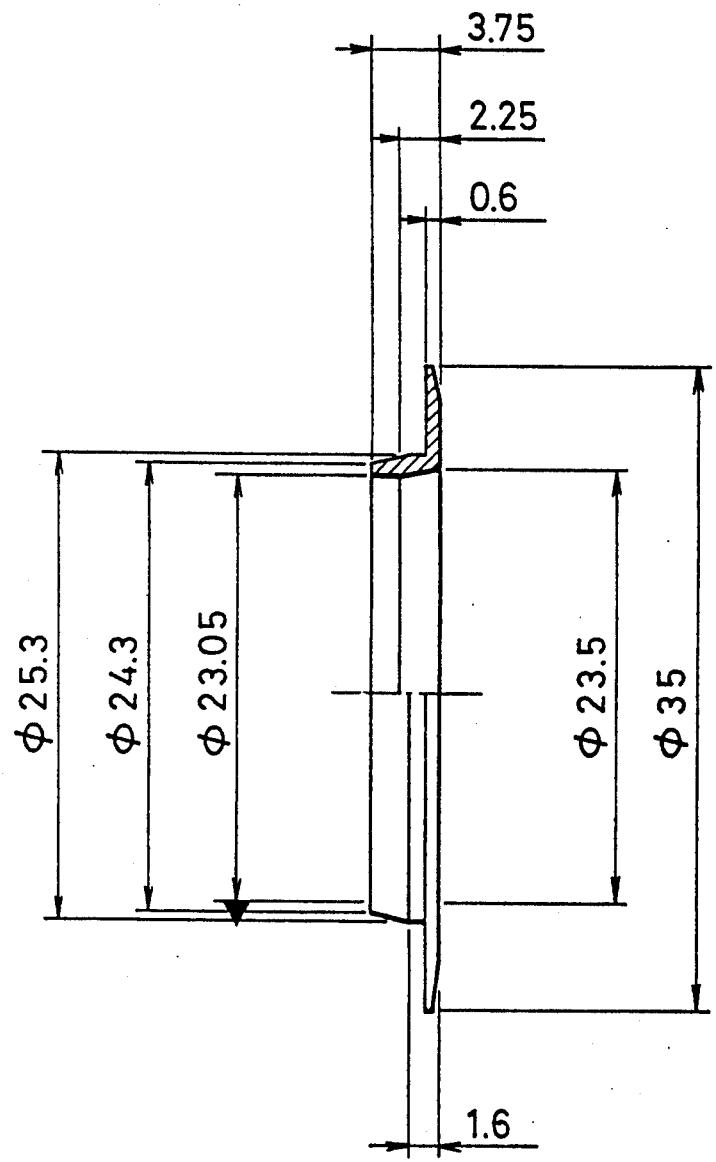
FIG. 5 is a dimensional drawing of a bush.

A tapered face 35 is provided on the plate surface of the flange portion 32 on the one end side adjacent to the outside circumference edge so as to decrease the thickness of the flange portion 32 in the direction of approaching the outside circumference. FIG. 5 shows one example of the size of the bush 30 (unit: mm).

Figure 2:
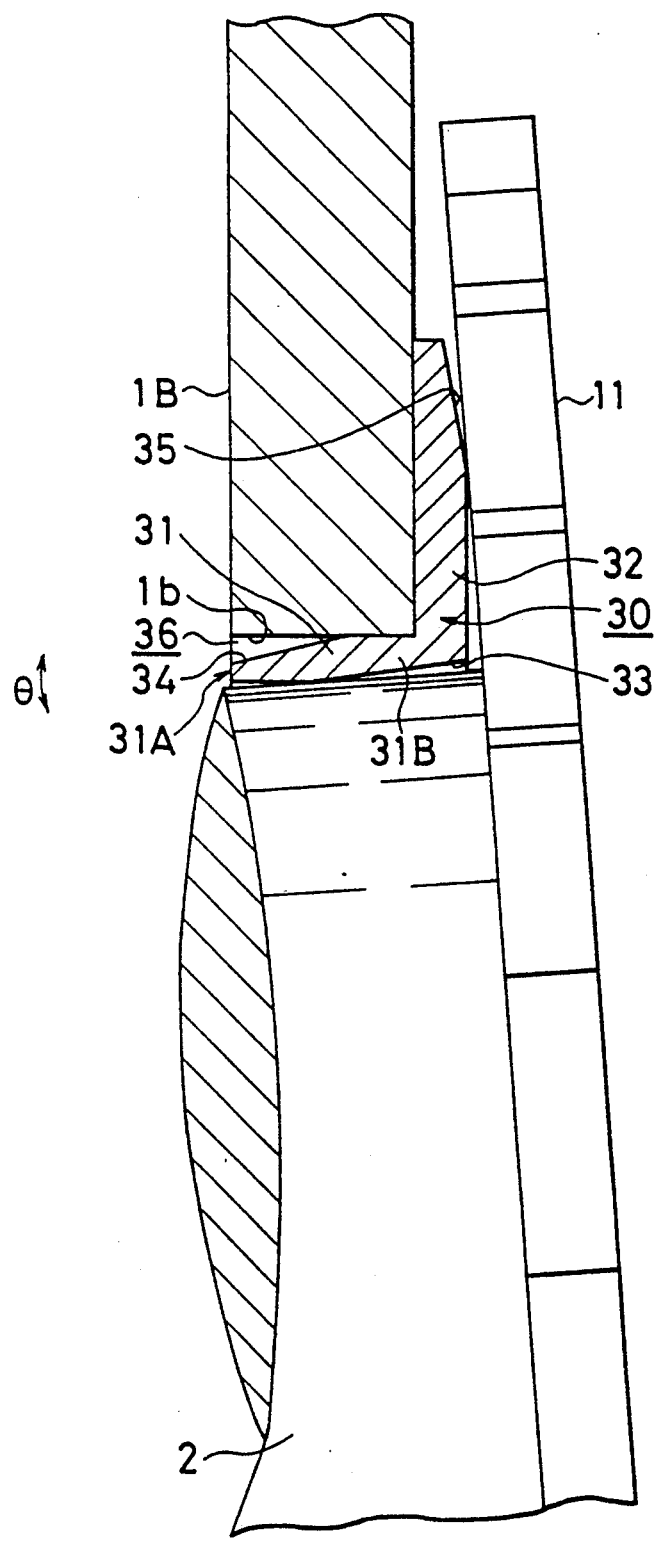
FIG. 2 is a sectional view of a bearing portion of a seat belt retractor.
Figure 3:
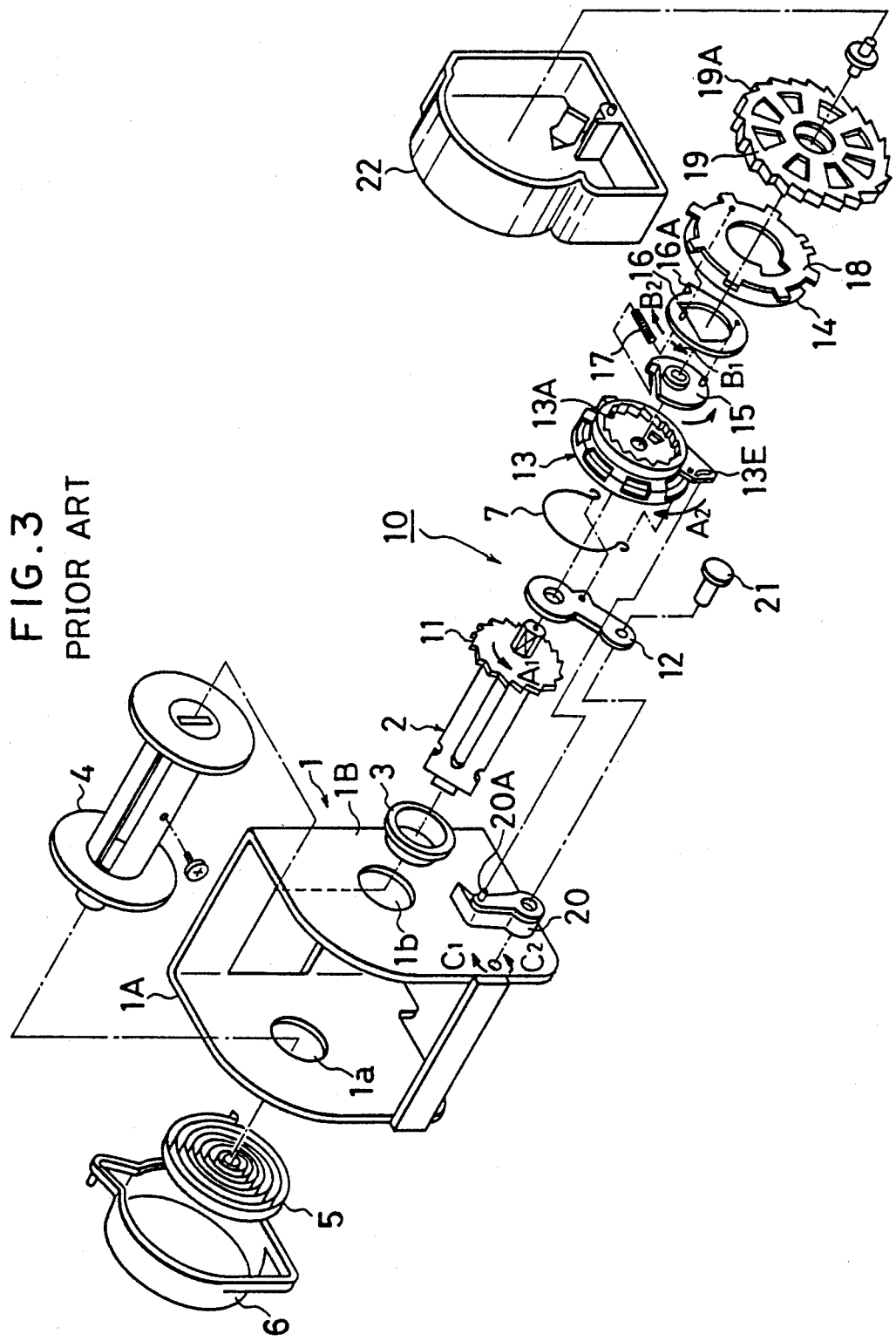
FIG. 3 is a perspective view of the seat belt retractor when assembled.
Figure 4:
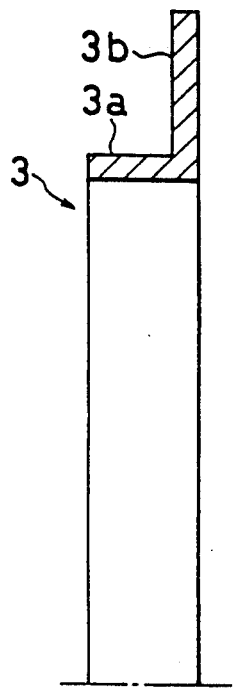
FIG. 4 is a sectional view of a conventional bush.

The bush 30 of the above arrangement is used to be attached to the supporting hole 1b on the side wall 1B of the seat belt retractor as shown in FIG. 2. With a bearing mechanism as above referred to, even if the axis of the shaft 2 slants with respect to the axis of the bush 30, as the tapered face 33 is provided, a part of the outside circumference face of the shaft 2 is not strongly pressed against a part of the inside circumference face of the bush 30. In the same way, as the tapered face 35 is provided at the flange portion 32, a part of the plate surface of a ratchet wheel 11 is not strongly pressed against a part of the plate surface of the flange portion 32. Therefore, the shaft 2 is always rotated smoothly.

Further, a tapered face 34 is provided on the outside circumference face of the cylindrical portion 31. Around the tapered face 34, a gap 36 is formed between the outside circumference face of the cylindrical portion 31 and the inside circumference face of the supporting hole 1b. Therefore, an end portion 31A of the cylindrical portion 31 can lean with respect to the other end portion 31B of the cylindrical portion 31 in the direction shown by an arrow O.

Consequently, the shaft 2 is elastically supported by the bush 30, and looseness and noise when rotated of the shaft 2 are prevented for certain.

It is preferable that the slant of the tapered face 35 with respect to the face which is orthogonal with respect to the axis of the cylindrical portion 31 is bigger than the slant of the tapered face 33 with respect to the axis of the cylindrical portion 31 as in the embodiment shown in the drawings, since the ratchet wheel 11 can be prevented for certain from being partially in contact with the flange portion 32.

What is claimed is:

1. A seat belt retractor comprising:
   a frame including a pair of side walls facing each other and shaft supporting holes provided at the side walls, respectively;
   a rotatable shaft disposed between the supporting holes;
   a reel mounted on said shaft and having a seat belt wound therearound; and
   a bush for supporting said shaft and attached to at least one of the supporting holes, said bush being made of a synthetic resin and comprising a cylindrical portion into which said shaft is inserted, said cylindrical portion having one end side and an opposite end side, a flange portion provided on one end side to be coaxial with the cylindrical portion, an inner tapered portion on the one end side of an inside circumference surface of the cylindrical portion, said inner tapered portion being tapered from the one end side toward the other end thereof to decrease an inner diameter, and an outer tapered portion on the opposite end side of an outside circumference surface of the cylindrical portion, said outer tapered portion being tapered from the outside circumference surface toward the other end thereof to decrease an outer diameter of the cylindrical portion.

2. A seat belt retractor according to claim 1, wherein said flange has an outside circumference edge and a plate surface at the one end side of the cylindrical portion, said flange being tapered from the plate surface toward the outside circumference edge of the flange portion to radially outwardly decrease a thickness of the flange portion.

3. A seat belt retractor according to claim 2, wherein a slant of a tapered face on the flange portion with respect to a face orthogonal to an axis of the cylindrical portion is larger than a slant of the inner tapered portion relative to the axis of the cylindrical portion.

* * * * *